(12) United States Patent
Jeong et al.

(10) Patent No.: US 7,670,867 B2
(45) Date of Patent: Mar. 2, 2010

(54) METHOD FOR MANUFACTURING CMOS IMAGE SENSOR HAVING MICROLENS THEREIN WITH HIGH PHOTOSENSITIVITY

(76) Inventors: Chang-Young Jeong, San 136-1, Ami-ri, Bubal-eub, Ichon-shi, Kyoungki-do 467-860 (KR); Dae-Ung Shin, San 136-1, Ami-ri, Bubal-eub, Ichon-shi, Kyoungki-do 467-860 (KR); Hong-Ik Kim, San 136-1, Ami-ri, Bubal-eub, Ichon-shi, Kyoungki-do 467-860 (KR)

( * ) Notice: Subject to any disclaimer, the term of this patent is extended or adjusted under 35 U.S.C. 154(b) by 958 days.

(21) Appl. No.: 11/242,817

(22) Filed: Oct. 3, 2005

(65) Prior Publication Data

US 2006/0019426 A1 Jan. 26, 2006

Related U.S. Application Data

(62) Division of application No. 10/737,227, filed on Dec. 16, 2003, now Pat. No. 6,979,588.

(30) Foreign Application Priority Data

Jan. 29, 2003 (KR) .................................. 2003-5765
Apr. 29, 2003 (KR) ............................... 2003-27019

(51) Int. Cl.
*H01L 21/00* (2006.01)
(52) U.S. Cl. .............................. 438/70; 438/73; 438/75; 438/144; 438/703
(58) Field of Classification Search .................. 438/69, 438/70, 74–75, 73, 144, 703; 257/292, 294, 257/432, 443
See application file for complete search history.

(56) References Cited

U.S. PATENT DOCUMENTS

| 6,001,540 | A  | * | 12/1999 | Huang et al. ................. 430/321 |
| 6,297,540 | B1 | * | 10/2001 | Assadi et al. ................ 257/432 |
| 6,531,266 | B1 | * |  3/2003 | Chang et al. ................. 430/321 |
| 6,623,668 | B1 | * |  9/2003 | Murakami et al. .......... 264/1.36 |
| 6,818,934 | B1 | * | 11/2004 | Yamamoto ................... 257/294 |
| 7,262,400 | B2 | * |  8/2007 | Yaung ...................... 250/208.1 |

(Continued)

FOREIGN PATENT DOCUMENTS

JP          04-025073        *  1/1992

(Continued)

*Primary Examiner*—M. Wilczewski
(74) *Attorney, Agent, or Firm*—McAndrews, Held & Malloy, Ltd.

(57) ABSTRACT

The method for manufacturing a CMOS image sensor is employed to prevent bridge phenomenon between adjacent microlenses by employing openings between the microlenses. The method includes the steps of: preparing a semiconductor substrate including isolation regions and photodiodes therein obtained by a predetermined process; forming an interlayer dielectric (ILD), metal interconnections and a passivation layer formed on the semiconductor substrate in sequence; forming a color filter array having a plurality of color filters on the passivation layer; forming an over-coating layer (OCL) on the color filter array by using a positive photoresist or a negative photoresist; forming openings in the OCL by patterning the OCL by using a predetermined mask; and forming dome-typed microlenses on a patterned OCL.

11 Claims, 10 Drawing Sheets

U.S. PATENT DOCUMENTS

| | | | |
|---|---|---|---|
| 7,262,448 B2 * | 8/2007 | Kim | 257/294 |
| 7,279,354 B2 * | 10/2007 | Hwang | 438/70 |
| 2001/0009442 A1 * | 7/2001 | Fukuyoshi et al. | 348/335 |
| 2001/0015778 A1 * | 8/2001 | Murade et al. | 349/43 |
| 2002/0051071 A1 * | 5/2002 | Itano et al. | 348/340 |
| 2002/0058350 A1 * | 5/2002 | Kim | 438/29 |
| 2002/0102498 A1 * | 8/2002 | Hsin | 430/321 |
| 2002/0114526 A1 * | 8/2002 | Dennis | 382/232 |
| 2006/0011813 A1 * | 1/2006 | Park et al. | 250/208.1 |
| 2006/0076590 A1 * | 4/2006 | Pain et al. | 257/294 |
| 2007/0045642 A1 * | 3/2007 | Li | 257/98 |
| 2007/0057338 A1 * | 3/2007 | Lee et al. | 257/432 |

FOREIGN PATENT DOCUMENTS

| | | | |
|---|---|---|---|
| JP | 04-129268 | * | 4/1992 |
| JP | 05-029590 | * | 2/1993 |
| JP | 06-326285 | * | 11/1994 |
| JP | 06-326287 | * | 11/1994 |
| JP | 08-001809 | * | 1/1996 |
| JP | 2001-094085 | * | 4/2001 |
| KR | 2000-44590 | | 7/2000 |
| KR | 2006-077085 | * | 7/2006 |

* cited by examiner

METHOD FOR MANUFACTURING CMOS IMAGE SENSOR HAVING MICROLENS THEREIN WITH HIGH PHOTOSENSITIVITY

The present patent application is a Divisional of application Ser. No. 10/737,227, filed Dec. 16, 2003 now U.S. Pat. No. 6,979,588.

FIELD OF THE INVENTION

The present invention relates to a method for manufacturing a semiconductor device; and, more particularly, to a method for manufacturing a complementary metal oxide semiconductor (CMOS) image sensor having microlenses therein with a high photosensitivity by forming openings between the microlenses.

DESCRIPTION OF THE PRIOR ART

As is well known, an image sensor is a semiconductor device converting an optical image to an electrical signal. Among various types of the image sensors, a charged coupled device (CCD) image sensor uses a plurality of metal-oxide-silicon (MOS) capacitors therein so that charge carriers are stored and transferred by the MOS capacitors. Meanwhile, a complementary MOS (CMOS) image sensor is a semiconductor device that converts an optical image to an electrical signal using a CMOS manufacturing technology, which employs a switching scheme of an MOS transistor for transportation of photo-electric charges from a photodiode to an output node as well as detection of an output signal at the output node.

The CCD image sensor has many demerits that complicated operation methods, high power consumption and a number of mask processes are required. Furthermore, it is very difficult to make a signal processing circuit integrated into a CCD chip. Accordingly, in order to overcome such demerits, many developments for the CMOS image sensor have been recently ensued using a submicron CMOS manufacturing technique. The CMOS image sensor creates a picture by detecting signals from the photodiode and the MOS transistors in a unit pixel. The use of a CMOS manufacturing technique can reduce power consumption compared with a CCD. Furthermore, while it is necessary to perform about 30 to 40 mask processes for manufacturing the CCD image sensor, the method for manufacturing the CMOS image sensor requires only about 20 mask processes, thereby simplifying the manufacturing process. Since an image signal processing circuit can be integrated together with light-sensing elements in one chip, the CMOS image sensor is highlighted as a next generation image sensor.

As well known, to embody color images in an image sensor, a color filter array is arranged over a pixel array, wherein color filter array usually includes an organic material that only transmits light with a specific wavelength band. For example, a blue color filter transmits light with the blue wavelength band and shields light with other wavelength band. The color filter array includes generally three colors of red, green and blue, or those of yellow, magenta and cyan.

The CMOS image sensor includes a pixel array for sensing the lights and accumulating photocharges and a logic circuit for processing the signal from the pixel array. In order to improve the photosensitivity of the CMOS image sensor, there have been proceeded endeavors to increase the area ratio of the photosensitive parts in the unit pixel, i.e., a fill factor. However, there are fundamentally limits in such endeavors, because the logic circuit parts can not be completely eliminated and thus, the photosensitive part has a limited area. Accordingly, in order to increase the photosensitivity, light-collecting technique has been researched. Using this technique, the pathways of the incident lights projected on the regions other than the photosensitive parts are changed, whereby much light is collected in the photosensitive parts. For collecting much more lights effectively, the image sensor employs microlenses on the color filter array.

There is provided in FIG. 1 a cross sectional view setting forth a conventional method for manufacturing the CMOS image sensor having microlenses therein.

In FIG. 1, the conventional method for manufacturing the CMOS image sensor begins with preparing a semiconductor substrate 110 obtained by a predetermined process. Isolation regions 112 are formed in the semiconductor substrate 110, thereby defining an active region and a field region. In each unit pixel, there is formed a corresponding photodiode 114 for converting an incident light to photocharges. For the sake of convenience, transistors required for the unit pixel is not depicted in the drawings.

After forming the isolation regions 112 and the photodiodes 114, an interlayer dielectric (ILD) 116 is formed on the semiconductor substrate 110. Thereafter, metal interconnections 118 are formed on predetermined locations of the ILD 116 in consideration of the underlying photodiodes 114 so that the incident light projected on the photodiodes 114 is not shielded by the existence of the metal interconnections 118.

Following a formation of the metal interconnections 118, a passivation layer 129 is formed over the resultant structure including the metal interconnections 118 for protecting a device from moisture and a scratch during post manufacturing processes.

Subsequently, color filter array 122 having a red, a green and a blue color filters is formed directly on the passivation layer 120 by using a typical method. Alternatively, after a planarized layer (not shown) is formed on the passivation layer 120, the color filter array 122 can be formed on the planarized layer. Each color filter is formed in a corresponding unit pixel for transmitting only a color with a predetermined wavelength band among a plurality of waves in the incident light. Herein, the color filter array 122 uses an exemplary dyed photoresist or a photoresist containing pogment.

While forming the color filter array 122, boundaries between the color filters are overlapped each other so as to form micro-steps therebetween. In order to form microlenses, however, an underlying layer on which microlenses will be formed should be planarized. Thus, an over coating layer (OCL) 124 is formed on the color filter array 122 for providing a planarized surface by using the photoresist material.

Afterward, a microlens layer is formed on the OCL 124 by using a method such as a spin on coating. Thereafter, the microlens layer is patterned into a predetermined configuration by using a predetermined mask, thereby forming a rectangular microlens correspondent to each unit pixel.

Finally, a thermal flow process is carried out to convert the rectangular microlenses to dome-typed microlenses 128, as shown in FIG. 1.

In the CMOS image sensor, as the dome-typed microlenses 128 are wider and wider, much more lights are concentrated in the photodiodes 114 to enhance a photosensitivity. However, as the dome-typed microlenses 128 are wider, it causes a problem that there may be happened a bridge phenomenon ('A') between the adjacent microlenses 128 during the thermal flow process. That is, according to the conventional method for manufacturing the CMOS image sensor having the microlenses therein, overflowed substances are collected between adjacent microlenses 128 during the flow process so that end portions of the dome-typed microlenses 128 cling together. Accordingly, such a bridge phenomenon ('A') incurs a poor photosensitivity of the CMOS image sensor. Moreover, since the dome-typed microlenses 128 are not aligned uniformly within an area of a corresponding unit pixel, it deteriorates an optical property in the long run.

SUMMARY OF THE INVENTION

It is, therefore, an object of the present invention to provide a method for manufacturing a complementary metal oxide semiconductor (CMOS) image sensor having microlenses therein with an enhanced photosensitivity and an optical property by introducing openings between the microlenses.

In accordance with a first aspect of the present invention, there is provided a method for manufacturing a complementary metal oxide semiconductor (CMOS) image sensor having microlenses therein, the method including the steps of: a) preparing a semiconductor substrate including isolation regions and photodiodes therein obtained by a predetermined process; b) forming an interlayer dielectric (ILD), metal interconnections and a passivation layer formed on the semiconductor substrate in sequence; c) forming a color filter array having a plurality of color filters on the passivation layer; d) forming an over-coating layer (OCL) on the color filter array by using a positive photoresist; e) forming openings in the OCL by patterning the OCL by using a binary mask, wherein the binary mask has coated portions and uncoated portions, the uncoated portions being disposed above boundaries between the color filters; and f) forming dome-typed microlenses on a patterned OCL.

In accordance with a second aspect of the present invention, there is provided a method for manufacturing a complementary metal oxide semiconductor (CMOS) image sensor having microlenses therein, the method including the steps of: a) preparing a semiconductor substrate including isolation regions and photodiodes therein obtained by a predetermined process; b) forming an ILD, metal interconnections and a passivation layer formed on the semiconductor substrate in sequence; c) forming a color filter array having a plurality of color filters on the passivation layer; d) forming an OCL on the color filter array by using a negative photoresist; e) forming openings in the OCL by patterning the OCL by using a binary mask, wherein the binary mask has coated portions and uncoated portions, the coated portions being disposed above boundaries between the color filters; and f) forming dome-typed microlenses on a patterned OCL.

In accordance with a third aspect of the present invention, there is provided a method for manufacturing a complementary metal oxide semiconductor (CMOS) image sensor having microlenses therein, the method including the steps of: a) preparing a semiconductor substrate including isolation regions and photodiodes therein obtained by a predetermined process; b) forming an ILD, metal interconnections and a passivation layer formed on the semiconductor substrate in sequence; c) forming a color filter array having a plurality of color filters on the passivation layer; d) forming an OCL on the color filter array by using a negative photoresist; e) forming openings in the OCL by patterning the OCL by using a phase shifted mask (PSM), wherein the PSM has a 0° phase and a 180° phase, boundaries between the 0° phase and the 180° phase being disposed above boundaries between the color filters; and f) forming dome-typed microlenses on a patterned OCL.

In accordance with a fourth aspect of the present invention, there is provided a method for manufacturing a complementary metal oxide semiconductor (CMOS) image sensor having microlenses therein, the method including the steps of: a) preparing a semiconductor substrate including isolation regions and photodiodes therein obtained by a predetermined process; b) forming an ILD, metal interconnections and a passivation layer formed on the semiconductor substrate in sequence; c) forming a first OCL, color filters, a second OCL and a third OCL on the passivation layer sequentially; d) patterning the third OCL into a preset configuration, thereby forming openings and a patterned third OCL; and e) forming dome-typed microlenses by carrying out a flow process.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 2 to 6 cross sectional views and a plane view setting forth a method for manufacturing a complementary metal oxide semiconductor (CMOS) image sensor in accordance with preferred embodiments of the present invention.

Referring to FIGS. 2A to 2D, there are shown cross sectional views setting forth a method for manufacturing a CMOS image sensor having microlenses therein in accordance with a first preferred embodiment of the present invention.

Figure 1:
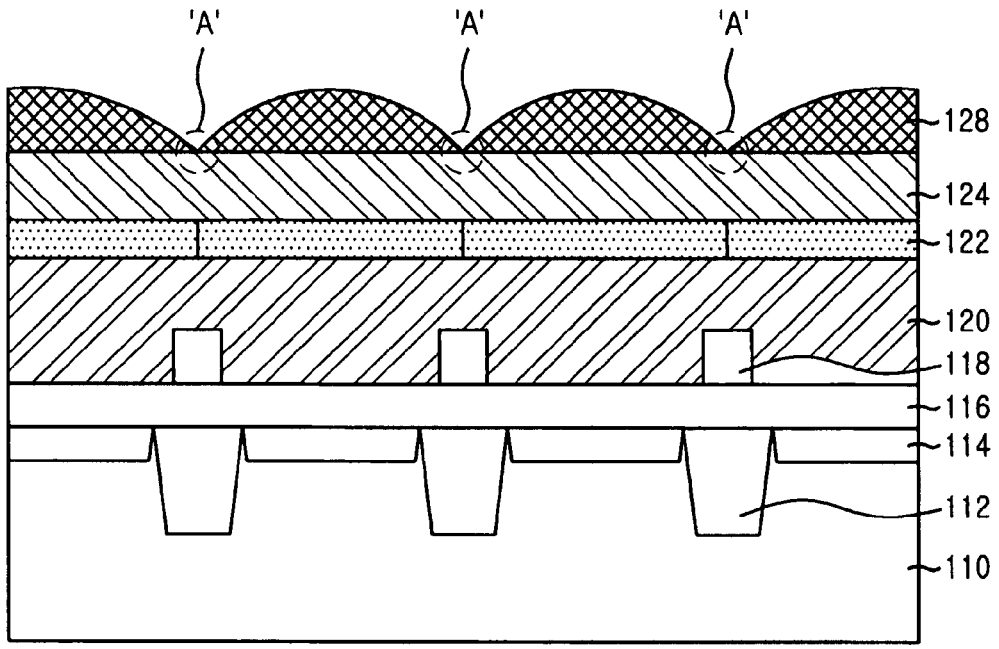
FIG. 1 is a cross sectional view setting forth a conventional method for manufacturing a complementary metal oxide semiconductor (CMOS) image sensor having microlenses therein.
Figure 2A:
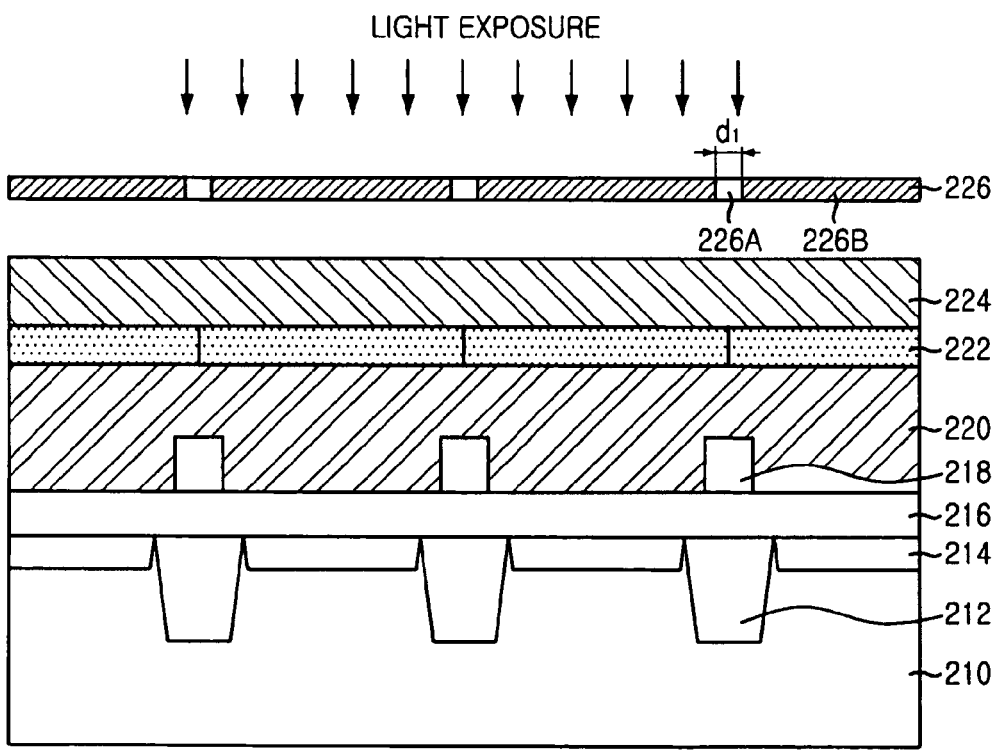
FIGS. 2A to 2D are cross sectional views setting forth a method for manufacturing a CMOS image sensor having microlenses therein in accordance with a first preferred embodiment of the present invention.

In FIG. 2A, a first inventive method for manufacturing the CMOS image sensor begins with preparing a semiconductor substrate 210 obtained by a predetermined process. Isolation regions 212 are formed in the semiconductor substrate 210, thereby defining an active region and a field region. In each unit pixel, there is formed a corresponding photodiode 214 for converting an incident light to photocharges. For the sake of convenience, transistors required for the unit pixel are not depicted in the drawings.

After preparing the semiconductor substrate 210, an interlayer dielectric (ILD) 216 is formed on the semiconductor substrate 210. Thereafter, metal interconnections 218 are formed on predetermined locations of the ILD 216 in consideration of underlying photodiodes 214 so that the incident light projected on the photodiodes 214 is not shielded by the existence of the metal interconnections 218.

Following the formation of the metal interconnections 218, a passivation layer 220 is formed over the resultant structure including the metal interconnections 218 for protecting a device from moisture and a scratch during post processes.

Subsequently, a color filter array 222 having three kinds of color filters is formed for transmitting only colors with predetermined wavelength bands among a plurality of waves in the incident light. Herein, the color filter array 222 is generally formed by using a dyed photoresist or a photoresist containing pogment, of which boundaries are overlapped each other so as to form micro-steps therebetween. In order to form microlenses 228A, however, an underlying layer on which the microlenses 228A will be formed should be planarized. Thus, an over-coating layer (OCL) 224 is formed on the color filter array 222 by using a positive photoresist correspondent to a post binary mask, for providing a planarized surface.

Thereafter, the mask 226 is prepared by making use of a conventional binary mask having uncoated portions 226A and coated portions 226B, wherein the uncoated portions 226A are disposed above boundaries of the color filters. The coated portions 226B are situated above the color filters which are coated with chromium (Cr). Herein, the uncoated portions 226A have widths (d1) of less than a maximum resolution and preferably, the widths of the uncoated portions 226A are less than about 0.2 µm in the first preferred embodiment of the present invention. Since the mask 226 has the uncoated portions 226A, it is possible to adjust critical dimensions (CD) of openings 205 and depths of the openings 205 by controlling the dose amount.

Figure 2B:
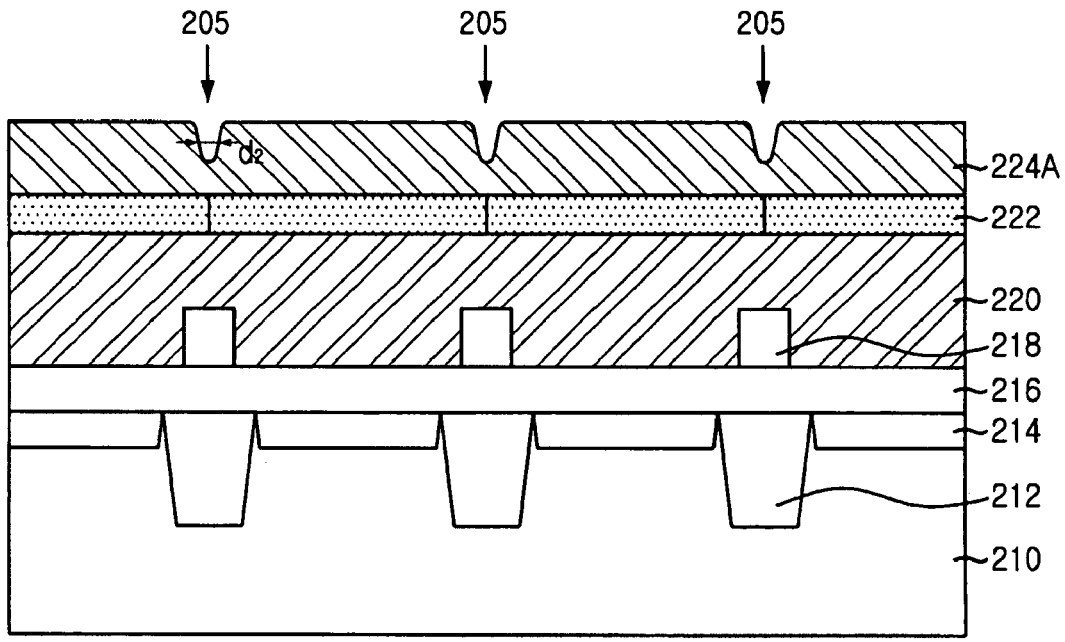

Afterward, referring to FIG. 2B, since the OCL 224 uses the positive photoresist, the OCL 224 under the uncoated portions 226A of the mask 226 is patterned into a predetermined shape and the OCL 224 under the coated portions 226B is left intact on the contrary, thereby forming the openings 205 and a patterned OCL 224A. Meanwhile, it is not necessary to form the wide and the deep openings 205 for preventing a bridge phenomenon during a post flow process. Thus, it is sufficient to form the small openings 205 having the widths less than the maximum resolution for preventing a bridge phenomenon. That is, in the first preferred embodiment, the openings 205 can be formed with the widths in the range of about 0.1 µm to about 0.2 µm by controlling the dose amount. After formation of the openings 205, a curing process is carried out for hardening the patterned OCL 224A.

Figure 2C:
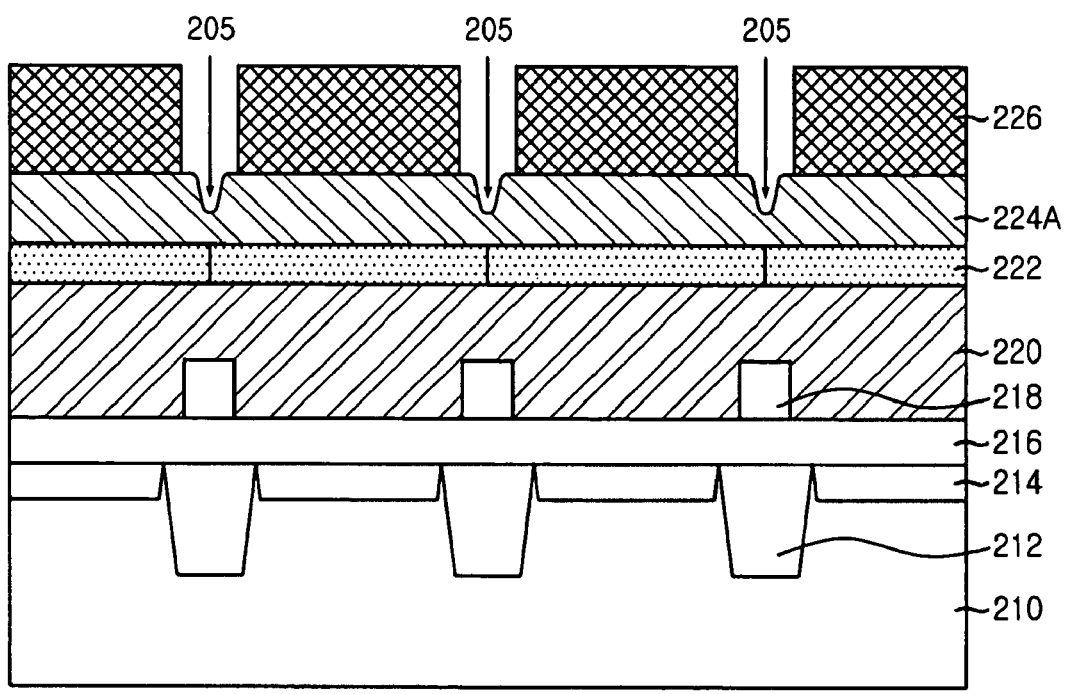

Subsequently, referring to FIG. 2C, a microlens layer is formed on the patterned OCL 224A and the openings 205 by employing a material such as a silicon oxide-based photoresist with a high optical transmittance property. Then the microlens layer is patterned into a predetermined configuration so as to form rectangular microlenses 228. It is noted that the rectangular microlens 228 should be formed with a predetermined width in consideration of a post flow process. That is, the width of the rectangular microlens 226 should be smaller than the width of the patterned OCL 224A between the openings 205.

Figure 2D:
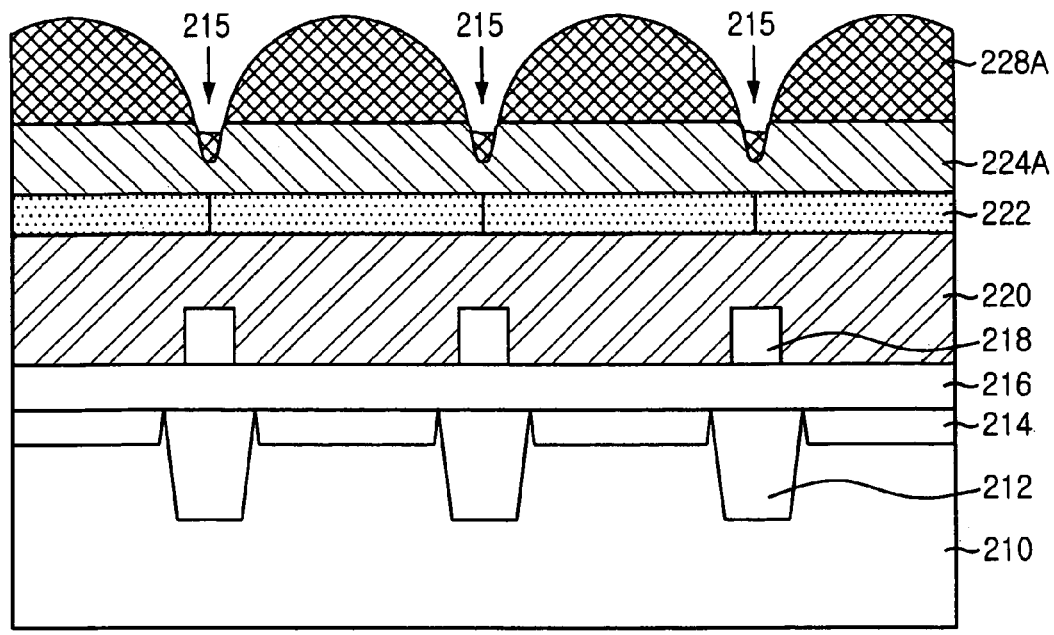

Finally, referring to FIG. 2D, the flow process is carried out, thereby forming dome-typed microlenses 228A. Herein, overflowed substances 215 detached from the rectangular microlenses 228 during the flow process are collected in the openings 205, whereby a bridge phenomenon between the adjacent microlenses 228A are effectively prevented. Moreover, since there is no bridge phenomenon, it is possible to enlarge the microlenses as wide as possible so that a photosensitivity of the CMOS image sensor can be enhanced without increasing a manufacturing cost because of using the conventional binary mask as the mask 226.

Referring to FIGS. 3A to 3D, there are provided cross sectional views setting forth a method for manufacturing a CMOS image sensor having microlenses therein in accordance with a second preferred embodiment of the present invention.

Figure 3A:
FIGS. 3A to 3D are cross sectional views setting forth a method for manufacturing a CMOS image sensor having microlenses therein in accordance with a second preferred embodiment of the present invention.
Figure 3A:
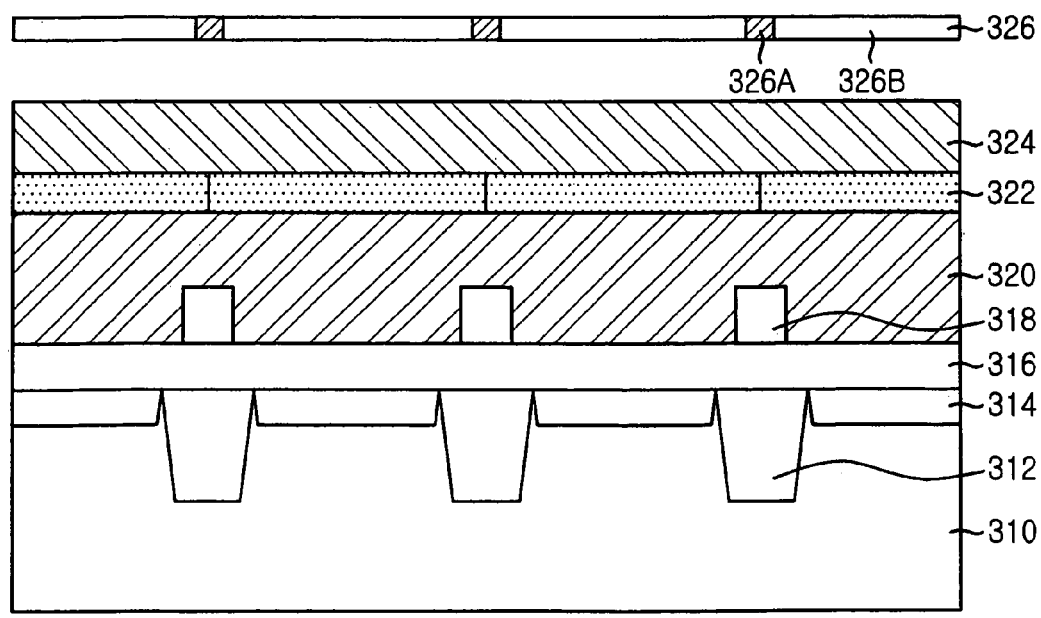

In FIG. 3A, a second method for manufacturing the CMOS image sensor begins with preparing a semiconductor substrate 310 obtained by a predetermined process. Since the processes for forming isolation regions 312, photodiodes 314, an ILD 316, metal interconnections 318, a passivation layer 320 and color filter array 322 are same to those of the first embodiment, further description will be abbreviated herein.

After carrying out above processes, an OCL 324 of a negative photoresist is formed on the color filter array 322 for providing a planarized surface where microlenses will be formed. Thereafter, a mask 326 is prepared by making use of a conventional binary mask having coated portions 326A and uncoated portions 326B therein, wherein the coated portions 326A are disposed above boundaries between the color filters 322 and the uncoated portions 326B are situated above the color filters.

Figure 3B:
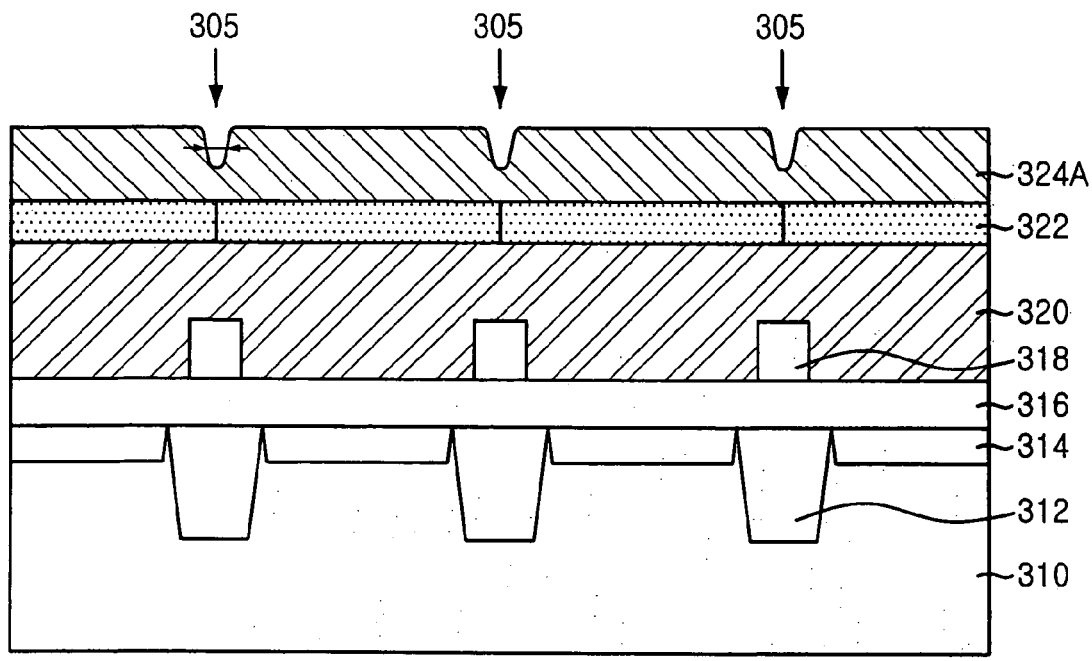

Subsequently, referring to FIG. 3B, the OCL 324 is patterned into a predetermined configuration by using the mask 326. In detail, since the OCL 324 uses the negative photoresist in the second embodiment, portions of the OCL 324 under the coated portions 326A of the mask 326 are patterned and the other portions of the OCL 324 under the uncoated portions 326B are left intact, thereby forming openings 305 and a patterned OCL 324A. After forming the openings 305, a curing process is carried out for hardening the patterned OCL 324A.

Figure 3C:
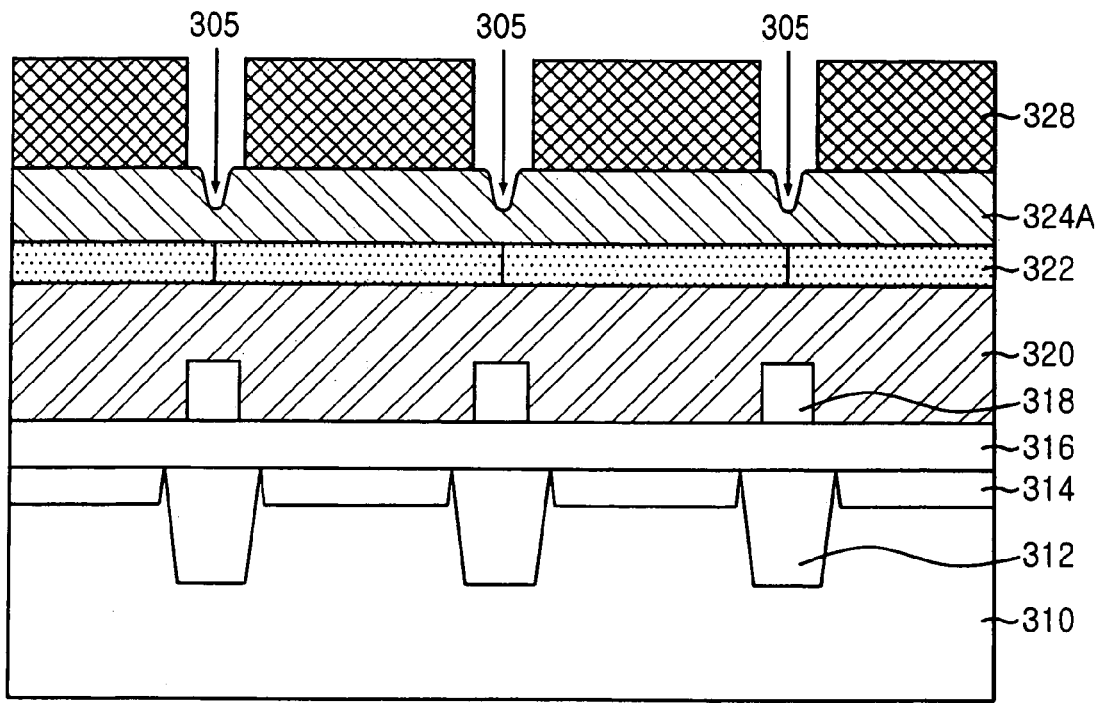

Following the formation of the openings 305, referring to FIG. 3C, a microlens layer is formed on the patterned OCL 324A and the openings 305 by employing a silicon oxide-based photoresist and is patterned into a predetermined configuration so as to form rectangular microlenses 328. It is noted that the rectangular microlens 328 should be formed with a predetermined width in consideration of a post flow process. That is, the width of the rectangular microlens 328 should be smaller than the width of the patterned OCL 324 between the openings 305.

Figure 3D:
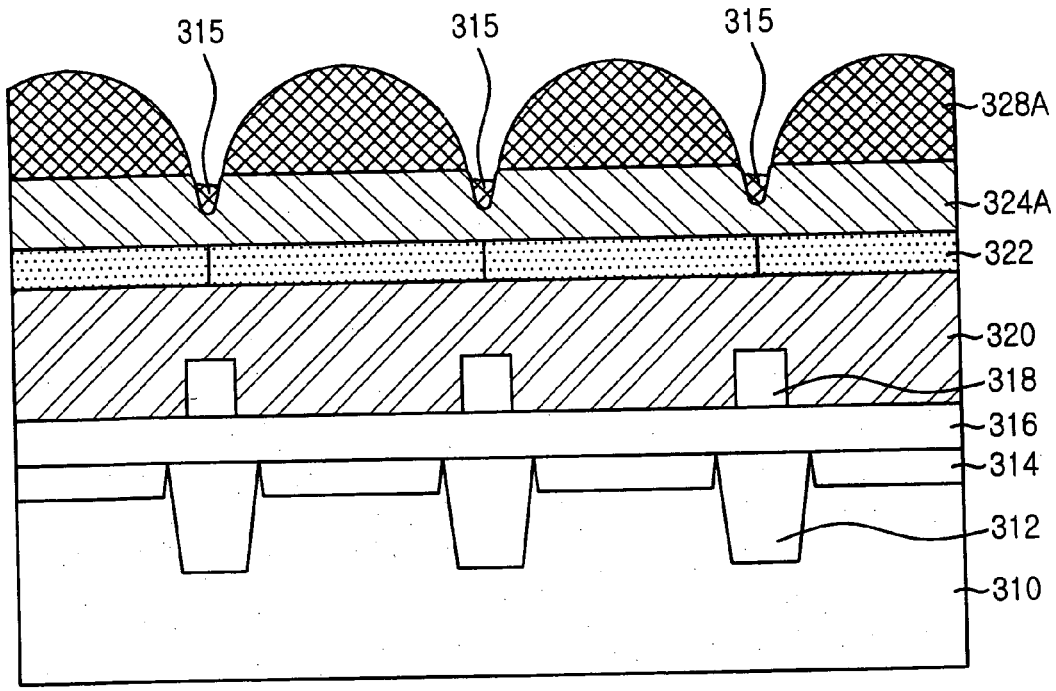

Finally, referring to FIG. 3D, the flow process is carried out, thereby forming dome-typed microlenses 328A. Herein, overflowed substances 315 detached from the rectangular microlenses 328 during the flow process are collected in the openings 305, whereby a bridge phenomenon between the adjacent microlenses 328A are effectively prevented like the first embodiment.

Referring to FIGS. 4A to 4D, there are provided cross sectional views setting forth a method for manufacturing a CMOS image sensor having microlenses therein in accordance with a third preferred embodiment of the present invention.

In the third preferred embodiment of the present invention, there is used a phase shifting mask (PSM) instead of the conventional binary mask in order to increase resolution. In general, the light passing through the PSM has 0° phase or 180° phase so that there is happened a destructive interference between 0° phase and 180° phase, i.e., zero light intensity, thereby improving resolution and depth of focus (DOF) in optical lithography.

Figure 4A:
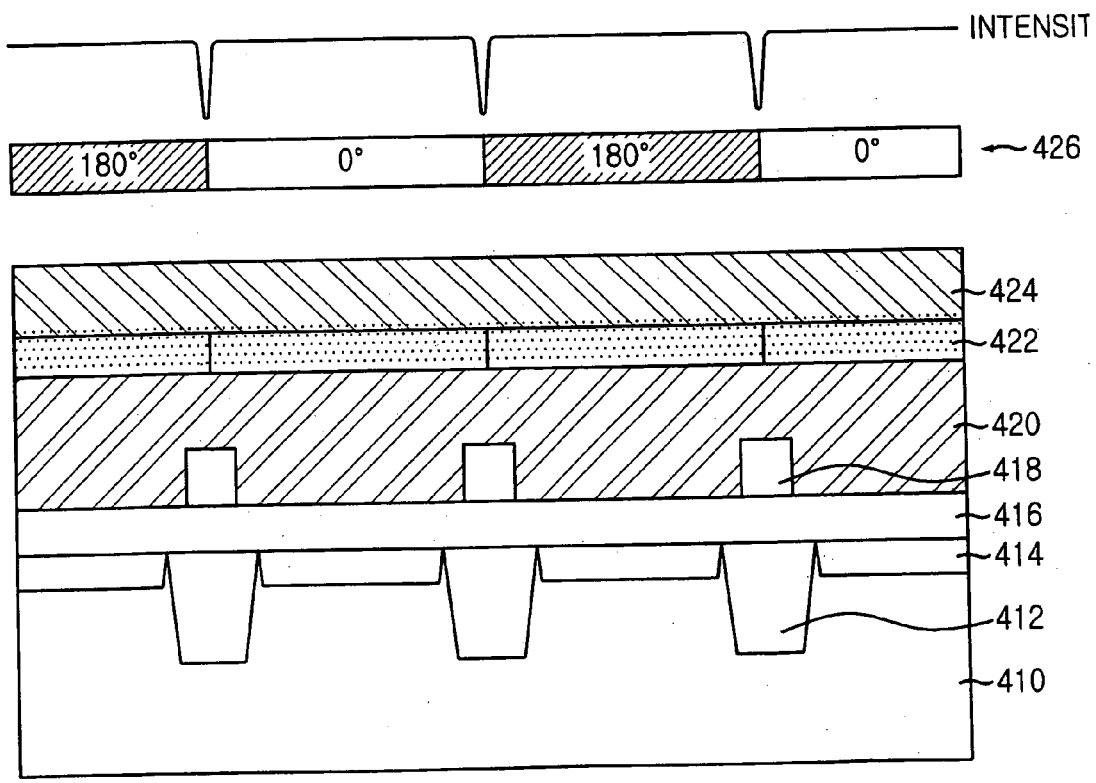
FIGS. 4A to 4D are cross sectional views setting forth a method for manufacturing a CMOS image sensor having microlenses therein in accordance with a third preferred embodiment of the present invention.

In FIG. 4A, a third method for manufacturing the CMOS image sensor begins with preparing a semiconductor substrate 410 obtained by a predetermined process. Since the processes for forming isolation regions 412, photodiodes 414, an ILD 416, metal interconnections 418, a passivation layer 420 and a color filter array 422 are same to those of the first and the second embodiments, further descriptions will be abbreviated herein.

After carrying out above processes, an OCL 424 is formed on the color filter array 422 for providing a planarized layer where microlenses will be formed. Herein, the OCL 424 uses a negative photoresist.

Figure 4B:
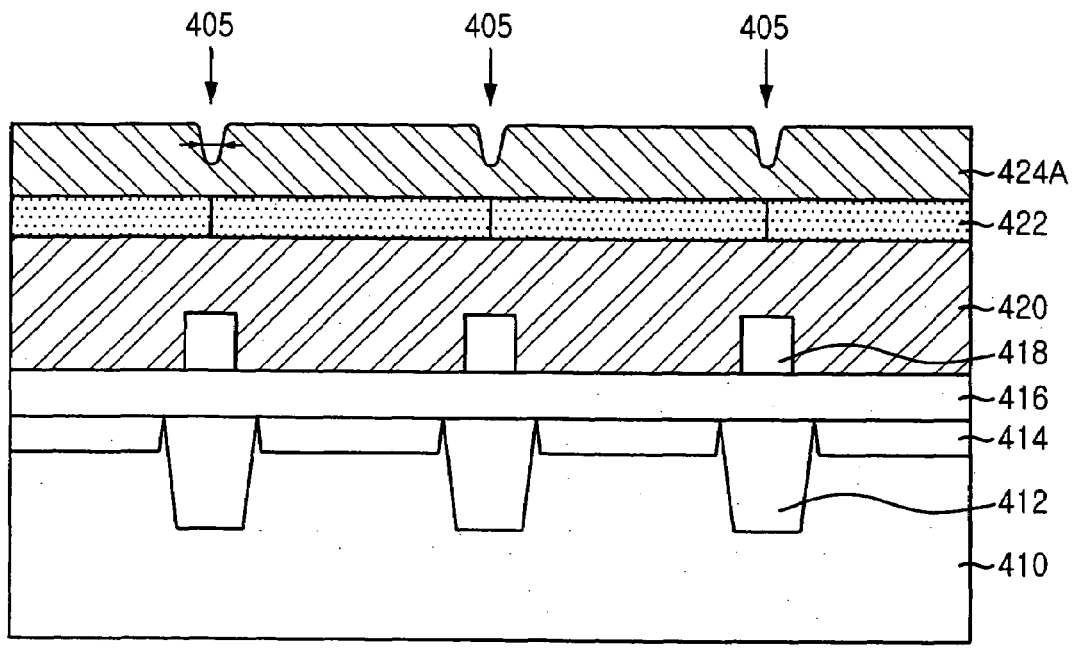

Subsequently, referring to FIG. 4B, the OCL 424 is patterned into a predetermined configuration by using the PSM 426. That is, since light intensity is about zero at around boundaries of 0° phase and 180° phase, portions of the OCL 424 under the boundaries are patterned and the other portions of the OCL 424 are left intact so that openings 405 and a patterned OCL 424A are formed. After forming the openings 405, a curing process is carried out for hardening the patterned OCL 424. The third embodiment employs the PSM 426 so as to form much more delicate openings 405 with the width in the range of about 0.03 µm to about 0.1 µm, thereby maximizing the width of the microlens in comparison with the first and the second embodiments making use of the binary mask.

Figure 4C:
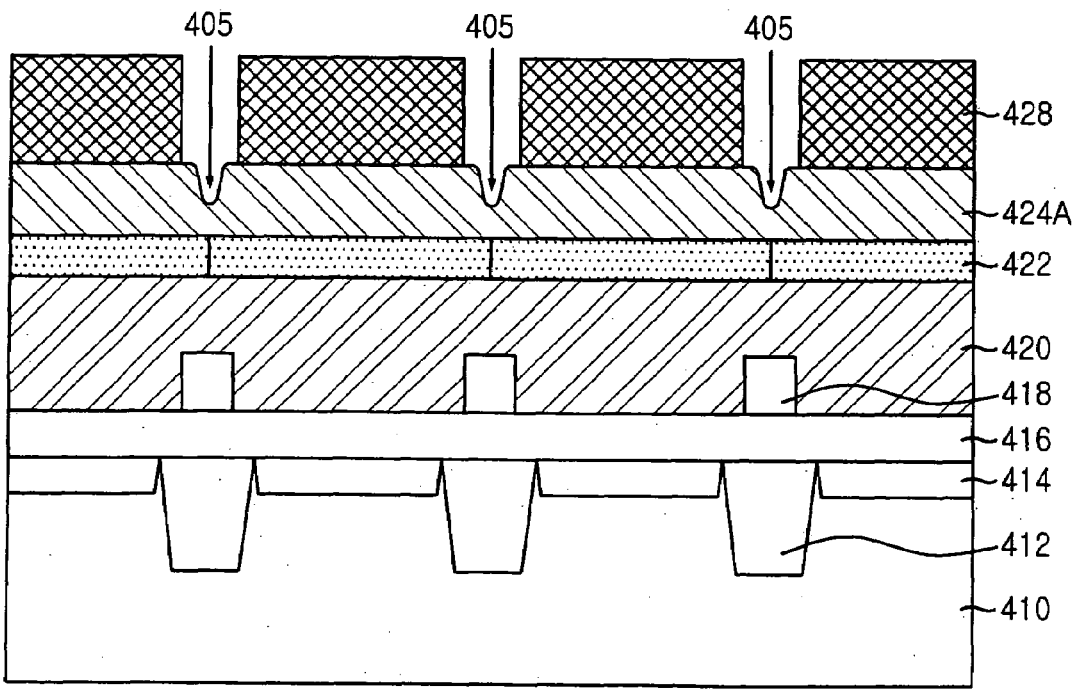

Following the formation of the openings 405, referring to FIG. 4C, a microlens layer is formed on the patterned OCL 424 and the openings 405 by employing a material such as a silicon oxide-based photoresist and is patterned into a predetermined configuration so as to form rectangular microlenses 428. It is noted that the rectangular microlens 428 should be formed with a predetermined width in consideration of a post flow process. That is, the width of the rectangular microlens 428 should be smaller than the width of the patterned OCL 424A between the openings 405.

Figure 4D:
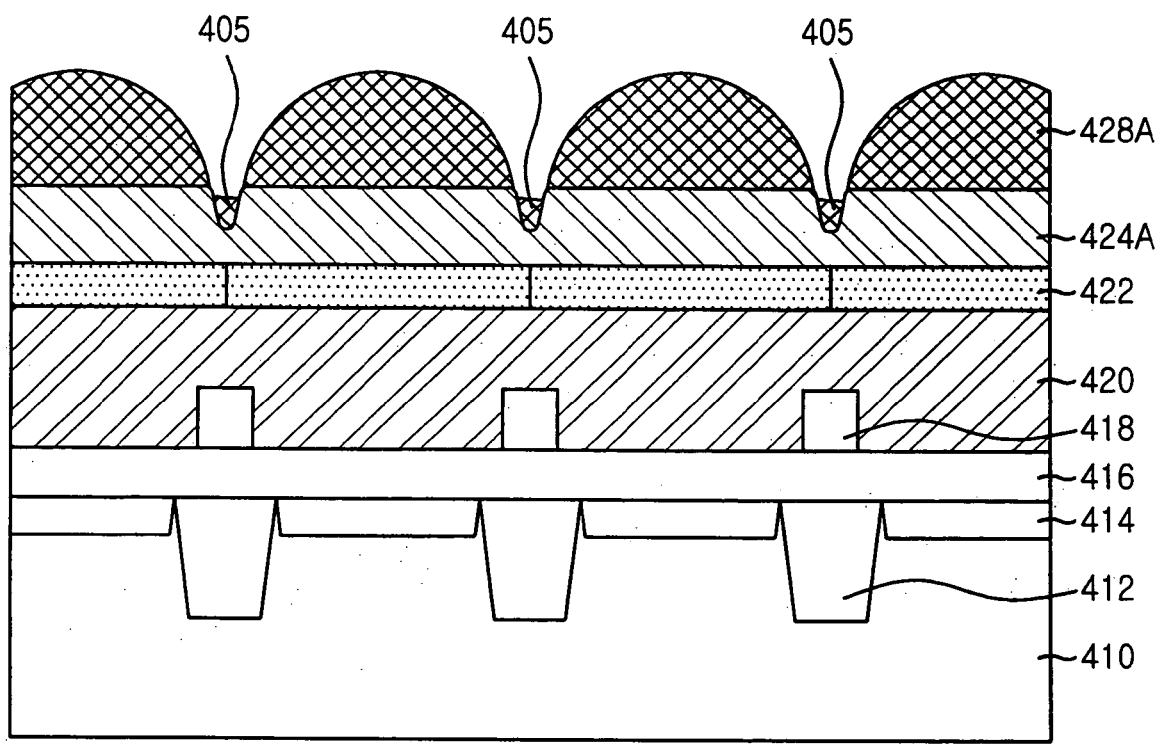

Finally, referring to FIG. 4D, the flow process is carried out so as to form dome-typed microlenses 428A. Herein, overflowed substances 415 detached from the rectangular microlenses 428 produced during the flow process are collected in the openings 405, whereby a bridge phenomenon between the adjacent microlenses 428A are effectively prevented.

Referring to FIGS. 5A to 5E, there are provided cross sectional views setting forth a method for manufacturing a CMOS image sensor having microlenses therein in accordance with a fourth preferred embodiment of the present invention.

Figure 5A:
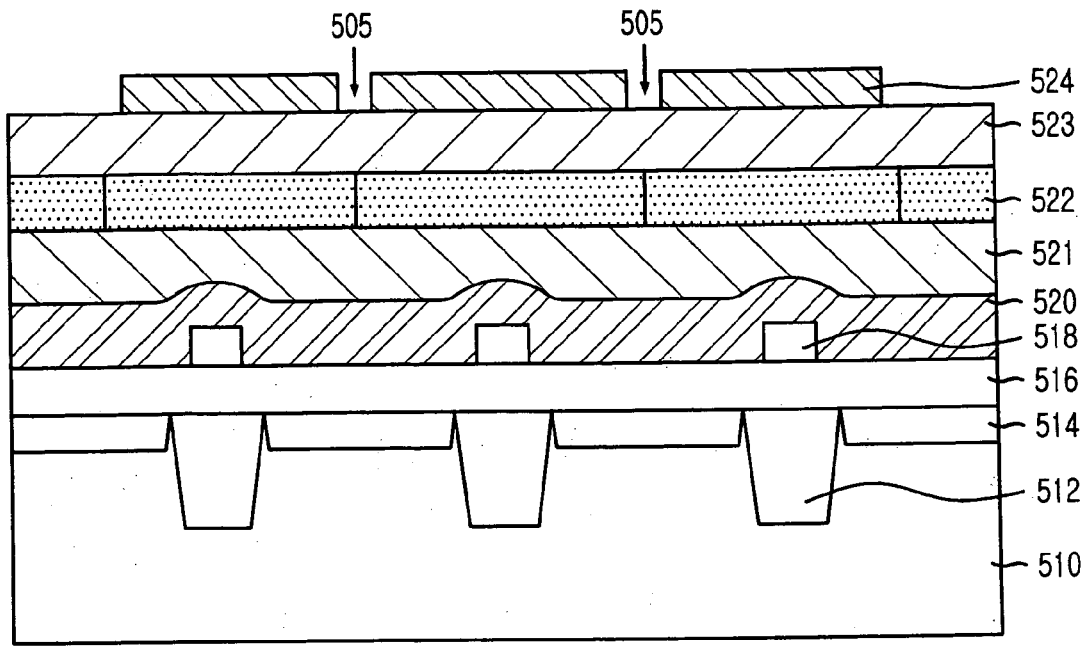
FIGS. 5A to 5E are cross sectional views setting forth a method for manufacturing a CMOS image sensor having microlenses therein in accordance with a fourth preferred embodiment of the present invention.

In FIG. 5A, the fourth method for manufacturing the CMOS image sensor begins with preparing a semiconductor substrate 510 obtained by a predetermined process. Then, since the processes for forming isolation regions 512, photodiodes 514, an ILD 516, metal interconnections 518 and a passivation layer 520 are same to those of the first, the second and the third embodiments, further descriptions are abbreviated herein. Furthermore, MOS transistors required in the CMOS image sensor are not depicted in the drawings for the sake of convenience.

After carrying out the above processes, a first OCL 521 such as a photoresist material is formed on the passivation layer 520 with the thickness of about 6,500 Å, for providing a planarized surface where a color filter array 522 will be formed.

Thereafter, the color filter array 522 is formed on a top face of the first OCL 521. In the fourth preferred embodiment, since the color filter array 522 is formed on the planarized layer, i.e., the first OCL 521, it is possible to form the color filter array 522 uniformly in comparison with the first, the second and the third embodiments.

Following the formation of the color filter array 522, a curing process is carried out for about three minutes at about 220° C., in order to prevent an inter-reaction and a chemical attack which may be happened between materials in the color filter array 522.

Thereafter, a second OCL 523 is formed on the color filter array 522 with the thickness of about 5,000 Å in order to overcome a problem of the steps formed between boundaries of the color filters and to provide a planarized surface where a third OCL will be formed. Afterward, a third OCL is formed with the thickness ranging from about 1,400 Å to about 1,600 Å on the second OCL 523 and then, is patterned into a predetermined configuration by using a predetermined mask such as a binary mask, a PSM or the like, thereby forming openings 505 and a patterned third OCL 524. It is noted that the deposition thickness of the third OCL is determined by considering the depths of the openings 505 for preventing the bridge phenomenon between adjacent microlenses. Herein, the openings 505 have widths of about 0.4 µm to about 0.6 µm. In addition, the widths of the openings 505 are smaller than those of the patterned third OCL 524 in consideration of forming microlenses thereon, as shown in FIG. 5A.

Figure 5B:
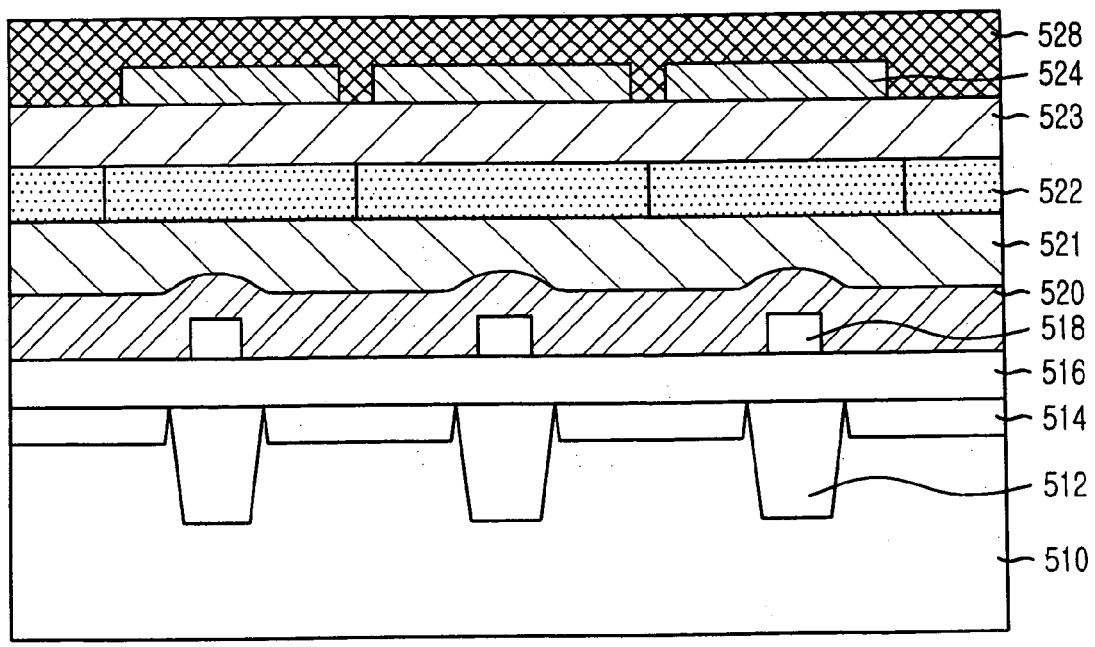

After forming the openings 505, referring to FIG. 5B, a microlens layer 528 is formed over the resultant structure with the thickness in the range of about 5,500 Å to about 7,500 Å including the patterned third OCL 524 and the openings 505. Herein, the microlens layer 528 employs a material such as silicon oxide-based photoresist with a high optical transmittance.

Figure 5C:
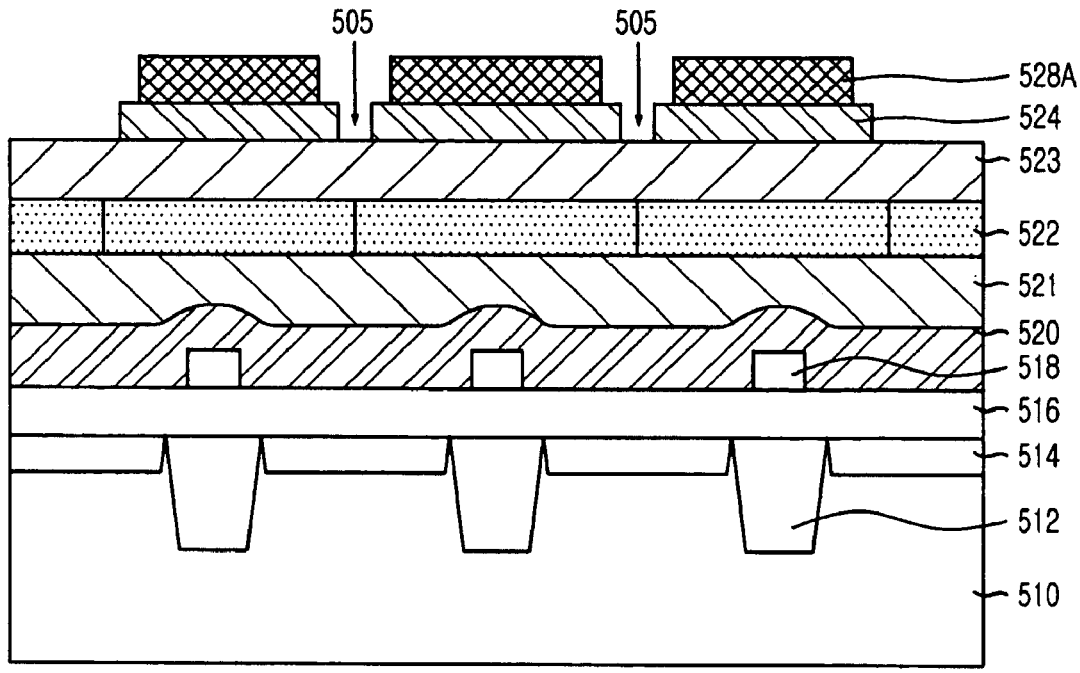

Thereafter, referring to FIG. 5C, the microlens layer 528 is patterned into a predetermined configuration, thereby forming rectangular microlenses 528A on the patterned third OCL 524, wherein the width of the rectangular microlens 528A is relatively smaller than the width of the patterned third OCL 524 between the openings 505 in consideration of a post flow process. In the fourth embodiment, since there is the second OCL 523 beneath the third OCL, the color filter array 522 is not damaged during the formation of the openings 505 because the patterning process for forming the openings 505 is carried out till the top face of the second OCL 523 is exposed. Furthermore, it is possible to form each opening 505 with a uniform depth.

Figure 5D:
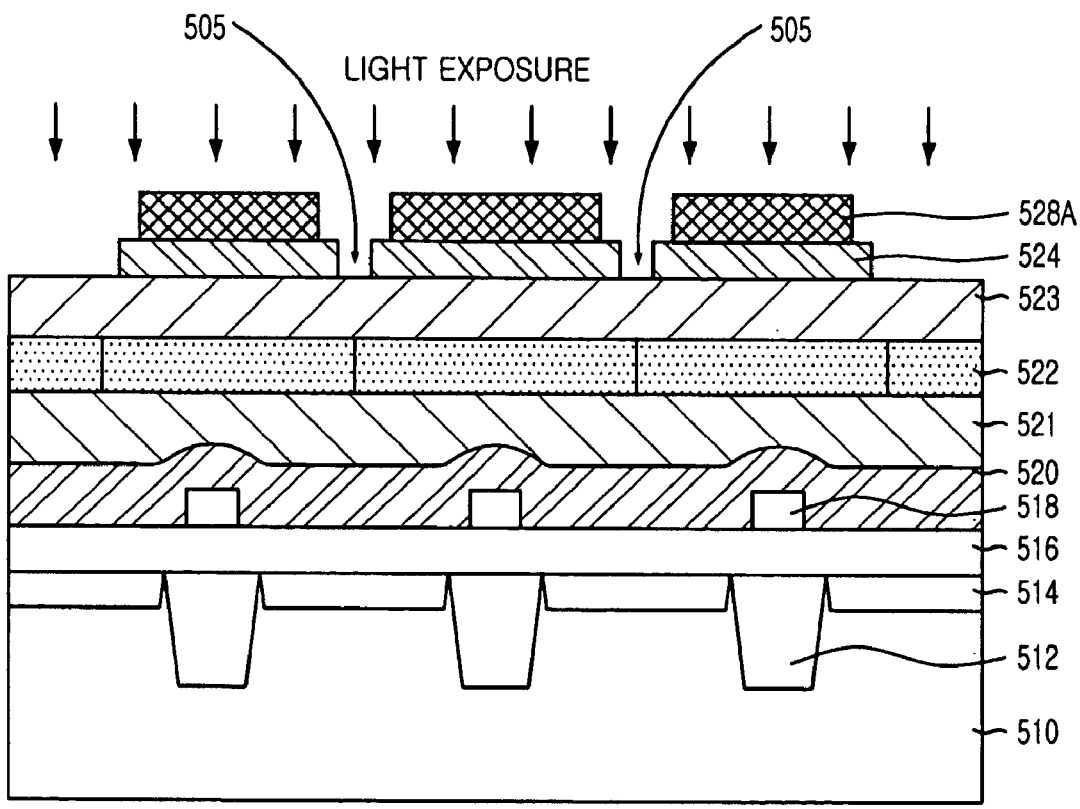

Subsequently, referring to FIG. 5D, a flow process is carried out in a stepper through a blank bleaching for converting the rectangular microlenses 528A to dome-typed microlenses 528B. During the blank bleaching, photo active compound (PAC) in the rectangular microlenses 528A is dissolved by degrees, thereby decreasing coherent forces thereamong gradually. Here, the blank beaching process is carried out for about five minutes at about 150° C. In particular, a thermal process after the flow process can promote the flow process more and more.

Figure 5E:
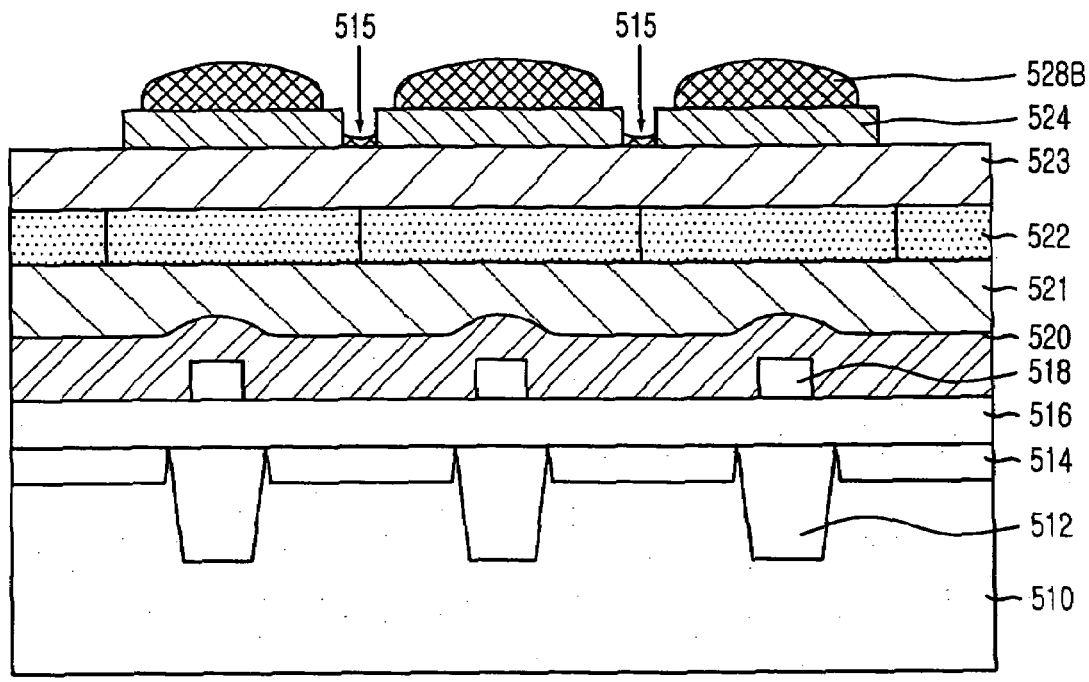

After carrying out the flow process, there are formed the dome-typed microlenses 528B as shown in FIG. 5E. During the flow process, overflowed substances 515 are collected in the openings 505 so that the bridge phenomenon between the adjacent microlenses is effectively prevented. Moreover, since the dome-typed microlenses 528B are formed within the area of the patterned third OCL 524, the dome-type microlenses 528B are uniformly formed not being lopsided to one side of the patterned third OCL 527.

Following the flow process, a curing process is carried out for about 5 minutes at about 200° C., for hardening the dome-typed microlenses 528B.

Figure 6:
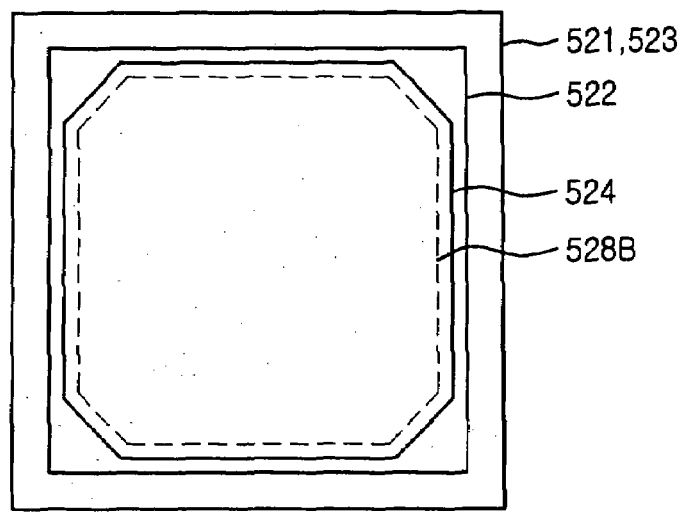
FIG. 6 is a plane view setting forth an arrangement of each element in a unit pixel array of a CMOS image sensor in accordance with the fourth preferred embodiment of the present invention.

Referring to FIG. 6, there is provided a schematic plane view setting forth an arrangement of each element in a unit pixel array of the CMOS image sensor in accordance with the fourth preferred embodiment.

In FIG. 6, it is easily understood that each element, i.e., each layer, is well aligned in the unit pixel array not being lopsided to one side thereof. In detail, the first OCL 521 has the same size to the second OCL 523 because the first and the second OCLs 521, 523 are formed by using the same mask (not shown), wherein the color filter array 522 is formed vertically between the first OCL 521 and the second OCL 523 as described above. The color filter array 522 is disposed within the area of the first and the second OCLs 521, 523. Furthermore, the patterned third OCL 524 of an octagonal shape similar to the dome-typed microlenses 528B is formed within the area of a corresponding color filter. In addition, the dome-typed microlenses 528B are formed within the area of the patterned third OCL 524. Accordingly, the fourth preferred embodiment provides an advantage that it is not difficult to measure the critical dimension (CD) of the dome-type microlenses 528B because they are aligned only within the area of the patterned third OCL 524.

As described above, in accordance with the preferred embodiments of the present invention, there are employed the openings in predetermined locations of the underlying OCL on which the microlenses will be formed so that it is possible to prevent the bridge phenomenon between the adjacent microlenses during the flow process, to thereby maximize the size of the microlens and reduce a chip size. Accordingly, much more lights passing through the microlenses are concentrated in the photodiode so that the CMOS image sensor has a good photosensitivity.

In addition, since the microlenses are formed within the area of the patterned OCL, the microlens has the uniform width and height. Therefore, each focal length of the light passing through each microlens becomes uniform, whereby increasing focused property to raise the image intensity.

While the present invention has been described with respect to the particular embodiments, it will be apparent to those skilled in the art that various changes and modifications may be made without departing from the scope of the invention as defined in the following claims.

What is claimed is:

1. A method for manufacturing a CMOS image sensor having microlenses therein, the method comprising:

preparing a semiconductor substrate including isolation regions and photodiodes obtained by a predetermined process;

forming an interlayer dielectric (ILD), metal interconnections and a passivation layer formed on the semiconductor substrate in sequence;

forming a first over-coating layer (OCL), a color filter array, a second OCL and a third OCL on the passivation layer sequentially;

patterning the third OCL into a preset configuration, forming openings and a patterned third OCL; and forming dome-typed microlenses on the patterned third OCL, wherein the pattered third OCL has an octagonal shape.

2. The method as recited in claim 1, wherein the first OCL is formed with a thickness of about 6,500 Å.

3. The method as recited in claim 1, wherein the second OCL is formed with a thickness of about 5,000 Å.

4. The method as recited in claim 1, wherein the third OCL is formed with a thickness in a range of about 1,400 Å to about 1,600 Å.

5. The method as recited in claim 1, wherein the forming of the dome-typed microlenses includes:

forming a microlens layer on the patterned third OCL;

forming rectangular microlenses by patterning the microlens layer into a predetermined configuration; and carrying out a flow process.

6. The method as recited in claim 5, wherein the microlens layer is formed with a thickness in a range of about 5,500 Å to about 7,500 Å.

7. The method as recited in claim 5, wherein the microlens layer uses a silicon oxide-based photoresist material.

8. The method as recited in claim 1, wherein a width and a height of an opening is adjusted by controlling a dose amount.

9. The method as recited in claim 5, wherein the carrying out of the flow process includes:

carrying out a blank bleaching process;

carrying out a flow process at about 150° C.; and carrying out a curing process at about 200° C. in order to harden the dome-typed microlenses.

10. The method as recited in claim 9, wherein the carrying out of the flow process at about 150° C. is carried out for about 5 minutes at about 150° C.

11. The method as recited in claim 9, wherein the carrying out of the flow process at about 200° C. is carried out for about 5 minutes at about 200° C.

* * * * *

UNITED STATES PATENT AND TRADEMARK OFFICE
CERTIFICATE OF CORRECTION

| | | |
|---|---|---|
| PATENT NO. | : 7,670,867 B2 | Page 1 of 1 |
| APPLICATION NO. | : 11/242817 | |
| DATED | : March 2, 2010 | |
| INVENTOR(S) | : Chang-Young Jeong, Dae-Ung Shin and Hong-Ik Kim | |

It is certified that error appears in the above-identified patent and that said Letters Patent is hereby corrected as shown below:

Column 10, line 13, delete the carriage return following "OCL,";

Column 10, line 38, delete "150° C." and insert --150° C--;

Column 10, line 39, delete "200° C." and insert --200° C--;

Column 10, line 42, delete "150° C." and insert --150° C--;

Column 10, line 43, delete "150° C." and insert --150° C--;

Column 10, line 45, delete "200° C." and insert --200° C--;

Column 10, line 46, delete "200° C." and insert --200° C--.

Signed and Sealed this

Fourth Day of January, 2011

David J. Kappos
*Director of the United States Patent and Trademark Office*